(12) United States Patent
Jung et al.

(10) Patent No.: US 11,553,605 B2
(45) Date of Patent: Jan. 10, 2023

(54) ELECTRONIC DEVICE INCLUDING HOUSING

(71) Applicant: Samsung Electronics Co., Ltd., Gyeonggi-do (KR)

(72) Inventors: Hyunjung Jung, Gyeonggi-do (KR); Hangyu Hwang, Gyeonggi-do (KR); Kwangyoun Lee, Gyeonggi-do (KR); Sungho Cho, Gyeonggi-do (KR); Changyoun Hwang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 30 days.

(21) Appl. No.: 17/141,334

(22) Filed: Jan. 5, 2021

(65) Prior Publication Data
US 2021/0219438 A1    Jul. 15, 2021

(30) Foreign Application Priority Data

Jan. 10, 2020    (KR) ........................ 10-2020-0003832

(51) Int. Cl.
| | |
|---|---|
| *H05K 7/02* | (2006.01) |
| *H05K 7/04* | (2006.01) |
| *H05K 5/00* | (2006.01) |
| *G02B 30/30* | (2020.01) |
| *H05K 5/03* | (2006.01) |

(52) U.S. Cl.
CPC .......... *H05K 5/0017* (2013.01); *G02B 30/30* (2020.01); *H05K 5/03* (2013.01)

(58) Field of Classification Search
USPC ........ 361/807, 728, 752, 796, 800, 809, 810
See application file for complete search history.

(56) References Cited

U.S. PATENT DOCUMENTS

| | | |
|---|---|---|
| 2010/0035005 A1 | 2/2010 | Zhang et al. |
| 2010/0128204 A1 | 5/2010 | Omote et al. |
| | (Continued) | |

FOREIGN PATENT DOCUMENTS

| | | |
|---|---|---|
| CN | 110290657 A | 9/2019 |
| CN | 111107197 A | 5/2020 |
| | (Continued) | |

OTHER PUBLICATIONS

International Search Report dated Apr. 27, 2021.

*Primary Examiner* — Hung S. Bui
(74) *Attorney, Agent, or Firm* — Cha & Reiter, LLC

(57) ABSTRACT

An electronic device is disclosed. The electronic device includes: a window; a display disposed in a first direction of the window; a housing including a first surface and a second surface extended from the first surface toward the window; a first film layer disposed on an inner surface of the housing and including: a first area that overlaps at least a portion of the first surface and is substantially transparent or translucent; and a second area that is extended from an edge of the first area along the second surface, and is substantially opaque; and a second film layer disposed on the first film layer in a second direction opposite to the first direction, the second film layer overlapping an entirety of the first area of the first film layer and overlapping a portion of the second area. Other embodiments are possible.

20 Claims, 11 Drawing Sheets

(56) References Cited

U.S. PATENT DOCUMENTS

| | | | |
|---|---|---|---|
| 2016/0066440 A1* | 3/2016 | Choi | G06F 1/1637 |
| | | | 361/679.3 |
| 2016/0268523 A1* | 9/2016 | Kim | G02F 1/133308 |
| 2016/0299527 A1* | 10/2016 | Kwak | G06F 1/1656 |
| 2016/0313763 A1 | 10/2016 | Ahn et al. | |
| 2018/0184532 A1* | 6/2018 | Kim | H05K 5/0017 |
| 2018/0249586 A1 | 8/2018 | Kim et al. | |

FOREIGN PATENT DOCUMENTS

| | | |
|---|---|---|
| KR | 10-2011-0035673 A | 4/2011 |
| KR | 10-1613934 B1 | 4/2016 |

\* cited by examiner

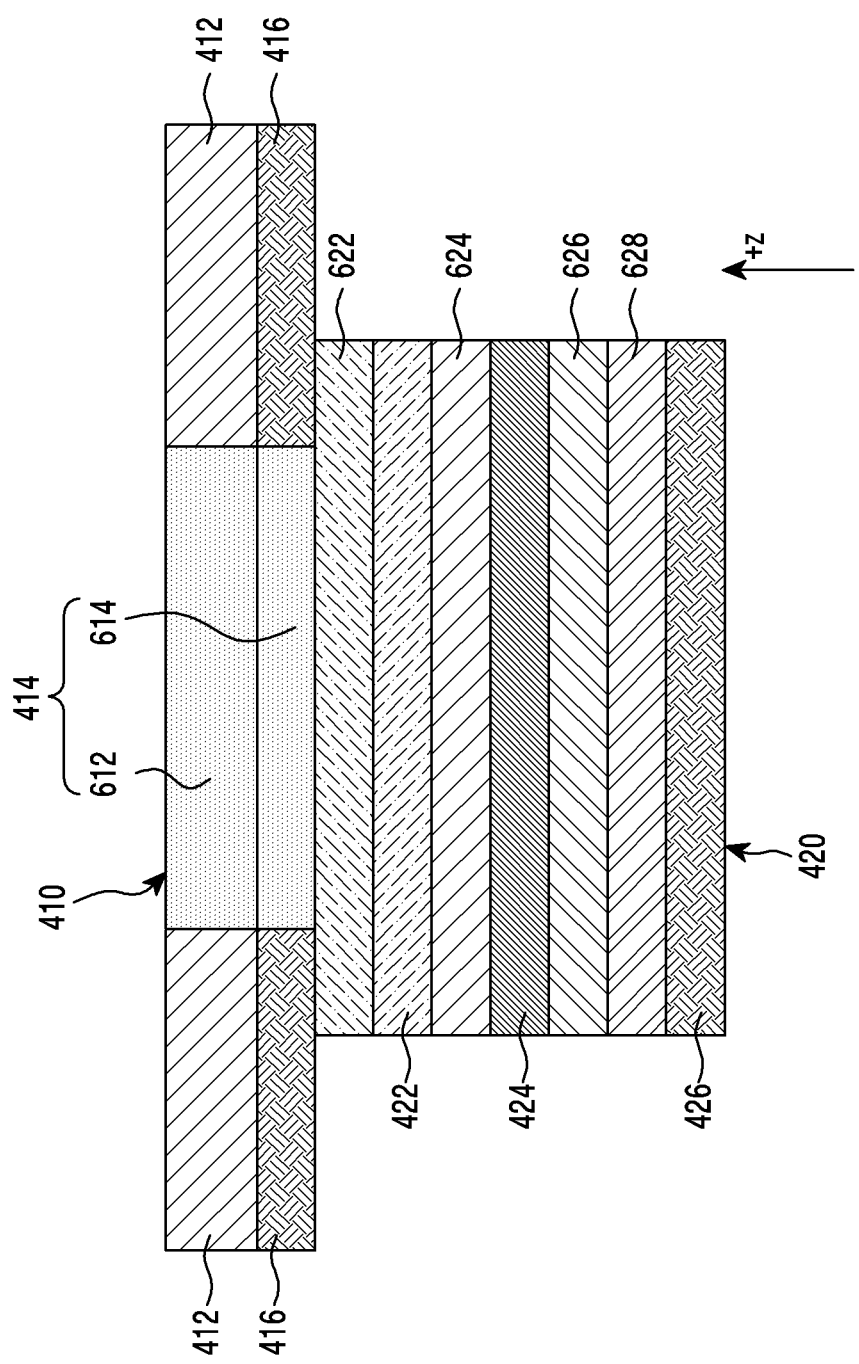

ELECTRONIC DEVICE INCLUDING HOUSING

CROSS-REFERENCE TO RELATED APPLICATION(S)

This application is based on and claims priority under 35 U.S.C. § 119 to Korean Patent Application No. 10-2020-0003832, filed on Jan. 10, 2020, in the Korean Intellectual Property Office, the disclosure of which is herein incorporated by reference in its entirety.

BACKGROUND

Field

One or more embodiments disclosed herein generally relate to an electronic device including a housing.

Description of Related Art

A housing of an electronic device may include a bottom portion and a sidewall extended from an edge of the bottom portion in a height direction of the housing. The electronic device may have various components mounted in a space provided by the bottom portion and the sidewall.

If the housing is manufactured to be substantially transparent, the electronic device may include a layer having various colors and a stereoscopic pattern, which is formed on an inner surface of the housing to hide components mounted in the housing and simultaneously provide a designed effect.

Various methods may be used to provide the layer having various colors and stereoscopic pattern. For example, a first method may be laminating a film having color and stereoscopic pattern on the entirety of the inner surface of an injection-molded housing, a second method may be insert injection molding the housing with the film being inserted into the mold, a third method may be laminating a film on the bottom portion of the housing or insert injection molding the housing while coating a sidewall, or a fourth method may be transferring a color and stereoscopic pattern of the film to the entire area of the inner surface of the housing along while injection molding the housing.

The above information is presented as background information only to assist with an understanding of the disclosure. No determination has been made, and no assertion is made, as to whether any of the above might be applicable as prior art with regard to the disclosure.

SUMMARY

Since the housing including a sidewall extended from an edge of a bottom portion in a height direction, the inner surface of the housing on which a color or a stereoscopic pattern layer is formed may be a 3D curved surface.

In the first method mentioned above, due to the curved area of the housing, the film may not be fully attached to the injection molding material, and the film may wrinkle or bubbles may be generated between the film and the housing.

In the second method mentioned above, a crack may be generated in the 3D stereoscopic pattern due to high cavity pressure in the mold during the injection molding.

In the third method mentioned above, there may be a problem where a boundary between the film layer and the coating layer is visible if thicknesses or colors of the film layer and the coating layer are not uniform.

In the fourth method mentioned above, a roll-type transfer film is used, and accordingly, there may be a problem where a relatively hard stereoscopic pattern is destroyed in the process of storing the transfer film and in the process of unrolling the transfer film when applying the transfer film to the housing.

An electronic device according to an embodiment includes: a window configured to form at least a portion of a front surface of the electronic device; a display disposed in a first direction of the window; a housing configured to form a rear surface of the electronic device and at least a portion of a side surface, and to accommodate the window and the display, a rear surface of the housing including a first surface having a curvature of a first range and a second surface having a curvature of a second range and extended from the first surface toward the window; a first film layer disposed on an inner surface of the housing facing the rear surface of the housing, the first film layer including: a first area that overlaps at least a portion of the first surface and is substantially transparent or translucent; and a second area that is extended from an edge of the first area along the second surface, and is substantially opaque; and a second film layer disposed on the first film layer in a second direction opposite to the first direction, the second film layer overlapping an entirety of the first area of the first film layer and overlapping a portion of the second area.

An electronic device according to an embodiment may include: a window configured to form at least a portion of a front surface of the electronic device; a transparent housing configured to form a rear surface of the electronic device and at least a portion of a side surface, and disposed under the window, the transparent housing including a bottom portion substantially parallel to the window and a sidewall bent from an edge of the bottom portion toward the window; a first film layer disposed on an inner surface of the transparent housing facing the rear surface across the bottom portion and the sidewall, the first film layer including: a transparent printing layer overlapping at least a portion of the bottom portion; a first color printing layer in contact with the sidewall and extended from an edge of the transparent printing layer along the sidewall; and a first shielding layer in contact with the first color printing layer and extended from the edge of the transparent printing layer along the first color printing layer; and a second film layer disposed under the first film layer and overlaps a portion of the first color printing layer and a portion of the first shielding layer.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 6 is a view illustrating a cross section of the first film layer and the second film layer according to an embodiment;

DETAILED DESCRIPTION

Figure 1:
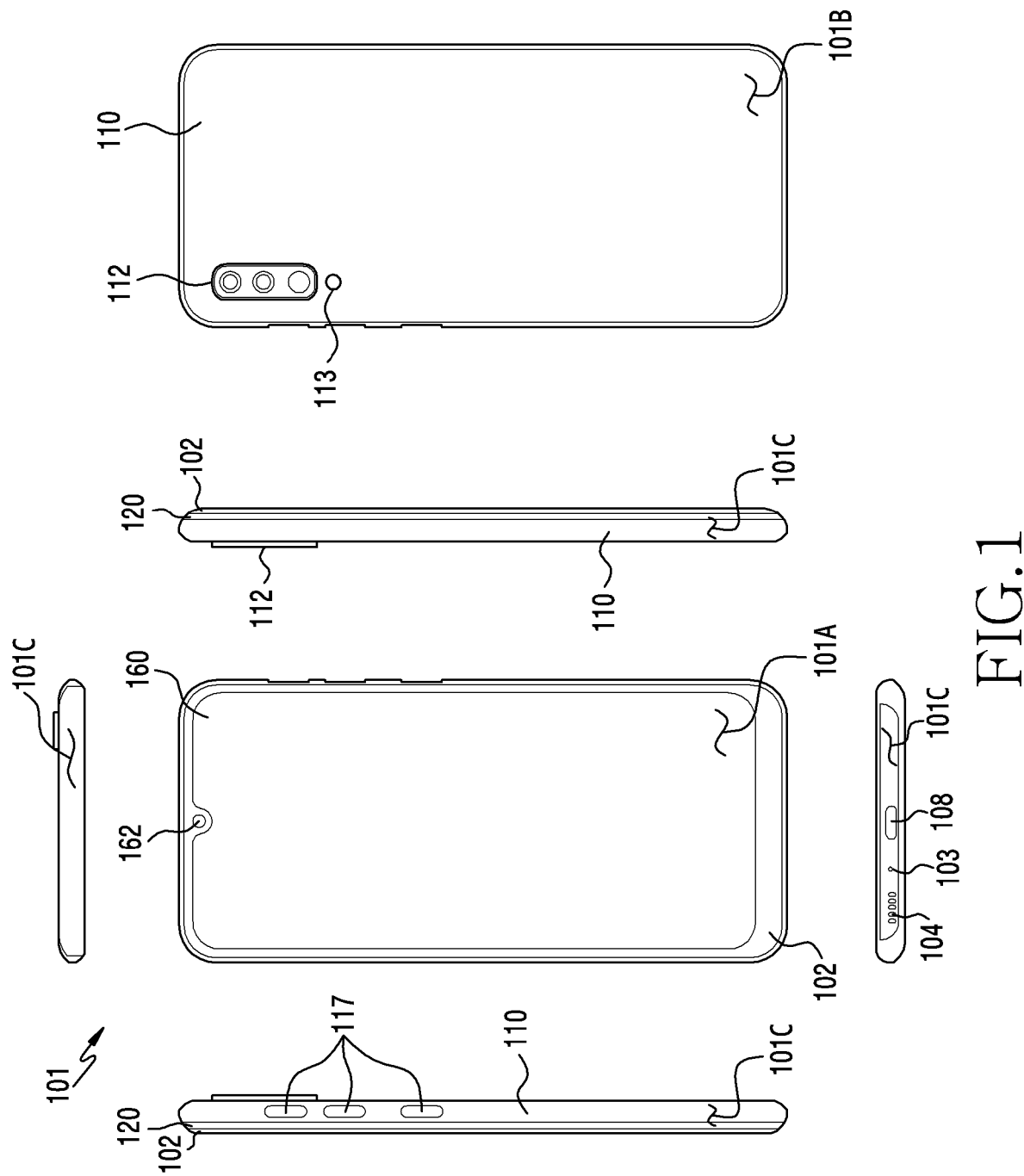
FIG. 1 is a view illustrating an electronic device according to an embodiment.

FIG. 1 illustrates an electronic device 101 according to an embodiment.

Referring to FIG. 1, the electronic device 101 according to an embodiment may include a window 102, a display 160, a housing 110, and a first bracket 120.

In an embodiment, the window 102 of the electronic device 101 may be substantially transparent. The window 102 may form at least a portion of a front surface 101A of the electronic device 101. The window 102 may be made of glass and/or polymer and include various coating layers.

In an embodiment, the display 160 may be disposed under the window 102. The display 160 may be seen through a corresponding portion of the window 102. In an embodiment, an edge of the display 160 may be substantially the same shape as an adjacent outer edge of the window 102. In another embodiment, the gap between the outer edge of the display 160 and the outer edge of the window 102 may be substantially the same all around the display 160 in order to maximize the area of the exposed portion of the display 160.

In an embodiment, the display 160 may be coupled with or disposed adjacent to a touch sensing circuit, a pressure sensor for measuring an intensity (pressure) of a touch, and/or a digitizer for detecting a stylus pen of a magnetic field method.

In an embodiment, the display 160 may include an opening 162. The opening 162 may have at least one of an audio module, a sensor module, a camera module, and/or a light emitting element (not shown) disposed therein. In another embodiment, at least one of the audio module, the sensor module, the camera module, a fingerprint sensor, and/or the light emitting element may be disposed on a back surface of the display area of the display 160 separate from the opening 162.

The audio module may include a receiver for communication, which is distinct from a speaker hole 104.

The sensor module may generate an electric signal or a data value corresponding to an operational state of the inside of the electronic device 101, or an external environmental state. The sensor module may include, for example, a proximity sensor and/or a fingerprint sensor. Alternatively, the fingerprint sensor may be disposed on a rear surface 101B of the electronic device 101 separate from the opening 162 of the display 160 or the back surface of the display 160.

In an embodiment, the electronic device 101 may further include at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

In an embodiment, the housing 110 of the electronic device 101 may include a substantially transparent area. For example, an entirety of the housing 110 may be substantially transparent, or a portion of the housing 110 may be substantially transparent and other portions thereof may be substantially opaque. The housing 110 may be made of glass, ceramic, a polymer, or a combination of at least two of the above-mentioned materials. The housing 110 may form at least a portion of the side surface 101C of the electronic device 101 and the rear surface 101B.

In an embodiment, the first bracket 120 may be disposed between the window 102 and the housing 110. At least a portion of the first bracket 120 may be accommodated in the housing 110, and the portion of the first bracket 120 that is accommodated in the housing 110 may not be visible from the outside of the electronic device 101. In an embodiment, the first bracket 120 may support various components (for example, a battery) of the electronic device 101. In an embodiment, the first bracket 120 may include metal (for example, aluminum) and/or a polymer.

According to an embodiment, the electronic device 101 may include at least one of the speaker hole 104, a microphone hole 103, a connector hole 108, a key input device 117, a camera module 112, and/or a flash 113.

In an embodiment, the microphone hole 103 may have a microphone disposed therein to acquire external sounds, and in a certain embodiment, the microphone hole 103 may have a plurality of microphones disposed therein to detect the directions of the sounds.

In an embodiment, the speaker hole 104 may be disposed on the side surface 101C of the electronic device 101. In an embodiment, the speaker hole 104 may be implemented as one hole along with the microphone hole 103 or the speaker hole 104 may not be necessary when a speaker without a hole (for example, a piezo speaker) is included in the electronic device.

In an embodiment, the connector hole 108 may accommodate a connector (for example, a USB connector) to exchange at least one of power, data, and/or an audio signal with an external electronic device.

In an embodiment, the key input device 117 may be disposed on the side surface 110C of the housing 110. In another embodiment, the electronic device 101 may not include a portion or the entirety of the key input device 117, and the portion of the key input device 117 that is not included may be implemented on the display 160 in other forms such as soft keys, etc. In a certain embodiment, the key input device 117 may include a sensor module (for example, a heart rate monitor (HRM) sensor, a fingerprint sensor).

In an embodiment, the camera module 112 may be disposed on the rear surface 101B of the housing 110. For example, the camera module 112 may be inserted into an opening formed on the rear surface 101B of the housing 110, and a portion of the camera module 112 may be disposed to protrude from the housing 110. The camera module 112 may include one or a plurality of lenses (for example, a wide angle lens and a telephoto lens), an image sensor, and/or an image signal processor.

In an embodiment, the flash 113 may include a light emitting diode or a xenon lamp. The flash 113 may provide a light source in association with an operation of the camera module 112 or may provide a light source irrespective of the operation of the camera module 112.

Figure 2:
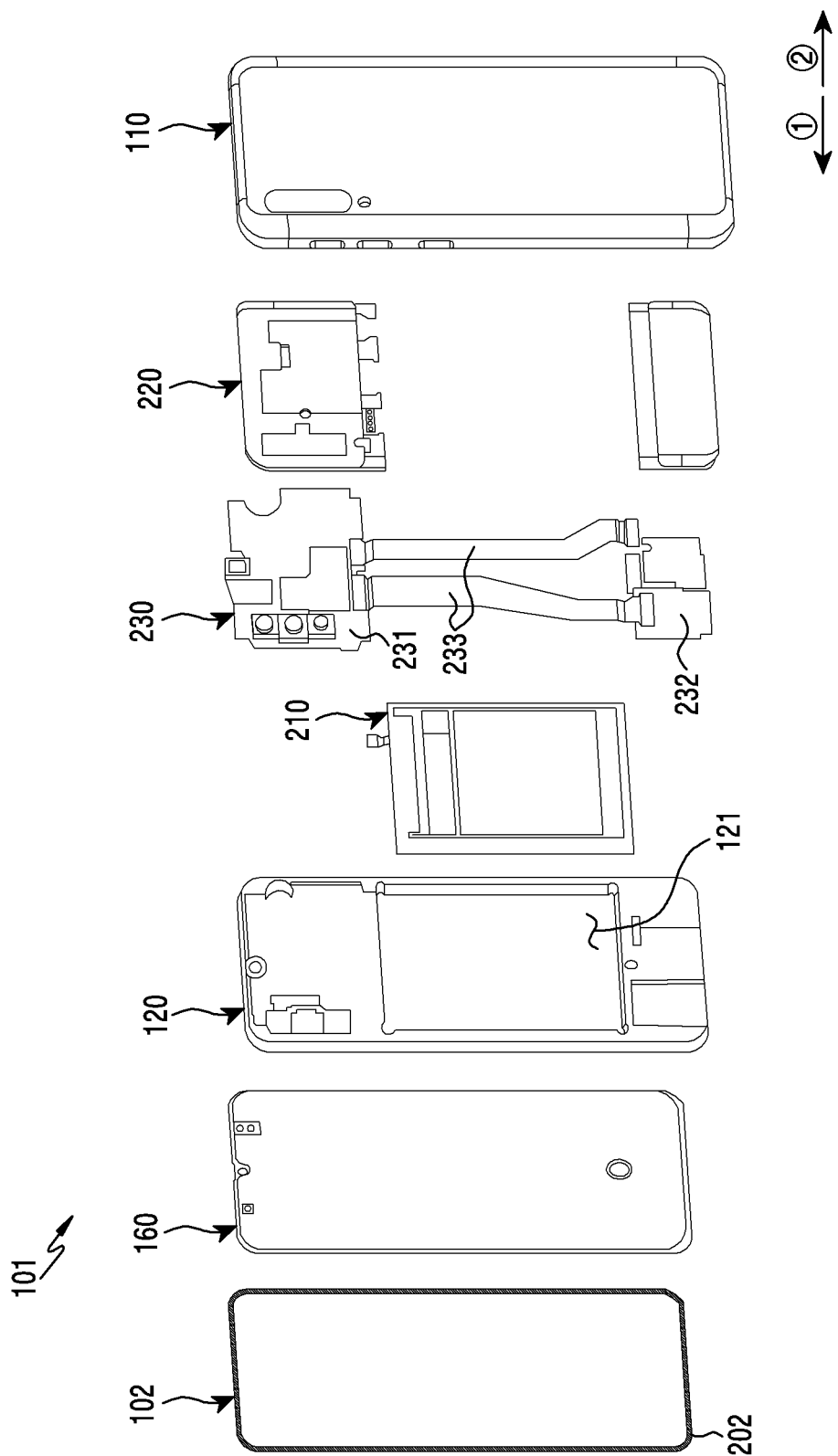
FIG. 2 is an exploded perspective view of an electronic device according to an embodiment.

FIG. 2 is an exploded perspective view of an electronic device 101 according to an embodiment.

Referring to FIG. 2, the electronic device 101 may include a window 102, a display 160, a first bracket 120, a battery 210, a printed circuit board (PCB) 230, a second bracket 220, and a housing 110.

In an embodiment, the window 102 may be disposed over (for example, in the ① direction) the display 160. The window 102 may further include a light shielding film 202 to hide the non-display area of the display 160 and a portion of the first bracket 120 that may be seen through the substantially transparent window 102.

In an embodiment, the display 160 may be disposed between the window 102 and the first bracket 120. The display 160 may be electrically connected with the PCB 230 by a flexible printed circuit board (FPCB) (not shown).

In an embodiment, the first bracket 120 may be disposed between the display 160 and the PCB 230. The first bracket 120 may support various components of the electronic device 101 or may provide spaces to accommodate the components of the electronic device 101. For example, the first bracket 120 may be disposed under (for example, in the ② direction) the display 160 to support the display 160. In another example, the first bracket 120 may provide a seating space 121 to accommodate the battery 210.

In an embodiment, at least a portion of the first bracket 120 may be used as an antenna radiator to transmit and receive wireless communication signals. The at least portion of the first bracket 120 utilized as the antenna radiator may include metal.

In an embodiment, the battery 210 may have at least a portion thereof accommodated and disposed in the seating space 121 of the first bracket 120. The battery 210 may store power necessary for the electronic device 101. The battery 210 may include, for example, a primary battery that is not rechargeable, a rechargeable secondary battery, or a fuel cell. The battery 210 may be integrally disposed in the electronic device 101, and may be disposed to be user-removable from the electronic device 101.

In an embodiment, the PCB 230 may be disposed between the first bracket 120 and the second bracket 220. The PCB 230 may be supported by the first bracket 120 and/or the second bracket 220.

The PCB 230 may have a processor, a memory, and an interface mounted thereon. The processor may include one or more of, for example, a central processing device, an application processor, a graphic processing device, an image signal processor, a sensor hub processor, or a communication processor. The memory may include, for example, a volatile memory or a nonvolatile memory. The interface may include at least one of, for example, a high definition multimedia interface (HDMI), a universal serial bus (USB) interface, a secure digital (SD) card interface, and/or an audio interface. The interface may electrically or physically connect the electronic device 101 to an external electronic device, and may include a USB connector, an SD card/multimedia card (MMC) connector, or an audio connector.

In an embodiment, the PCB 230 may provide an electric connection path between various components of the electronic device 101. For example, a camera module 112, the battery 210, the display 160, and the processor may be directly or indirectly and electrically connected with the PCB 230, respectively, and the processor may be operatively coupled with the camera module 112, the battery 210, and the display 160 through the electric connection path provided by the PCB 230.

In an embodiment, the PCB 230 may include a first PCB 231, a second PCB 232, and a flexible printed circuit board (FPCB) 233 connecting the first PCB 231 and the second PCB 232. In another embodiment not shown in FIG. 2, the PCB 230 may not be divided into the first PCB 231 and the second PCB 232 and may be integrally formed therewith.

In an embodiment, the second bracket 220 may be disposed between the PCB 230 and the housing 110. The second bracket 220 may be accommodated in a space formed by the housing 110. The second bracket 220 may include metal and/or non-metal (for example, polymer).

In an embodiment, the housing 110 may be disposed under (for example, in the ② direction) the second bracket 220. In an embodiment, the housing 110 may be physically coupled with the first bracket 120 and/or the second bracket 220. For example, the housing 110 may be coupled with the first bracket 120 and/or the second bracket 220 by at least one coupling member (for example, a screw (not shown)). In another example, the housing 110 may be coupled with the first bracket 120 and/or the second bracket 220 by an adhesive member (for example, an adhesive tape or an adhesive solution (not shown)).

Figure 3:
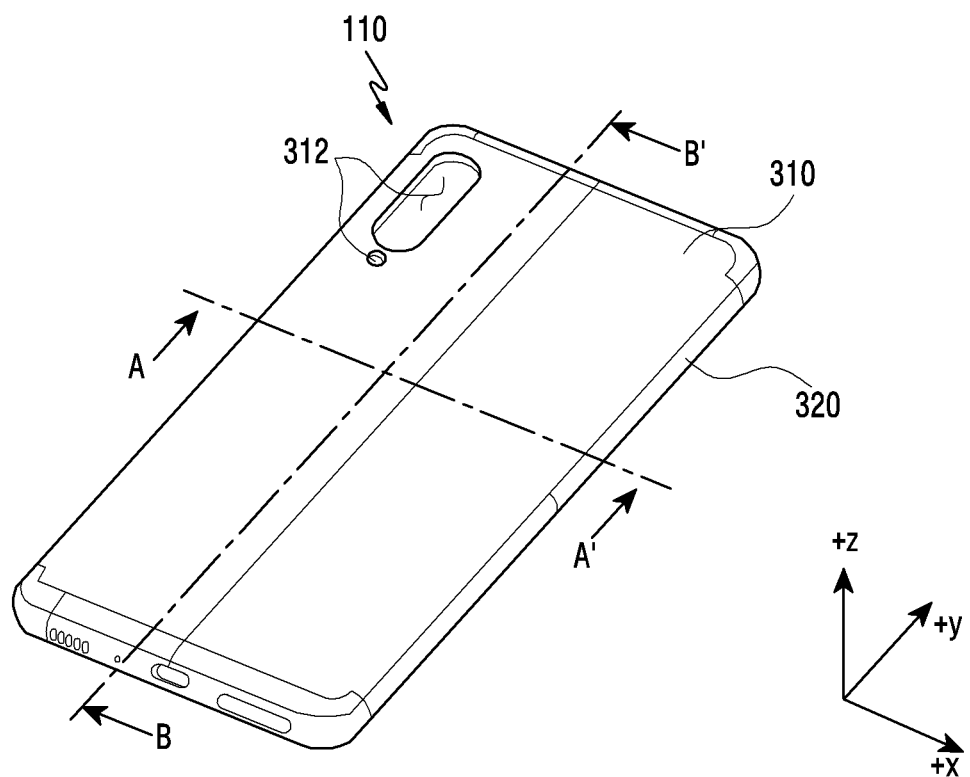
FIG. 3 is a perspective view of a housing according to an embodiment.

FIG. 3 is a perspective view of a housing 110 according to an embodiment.

Figure 4A:
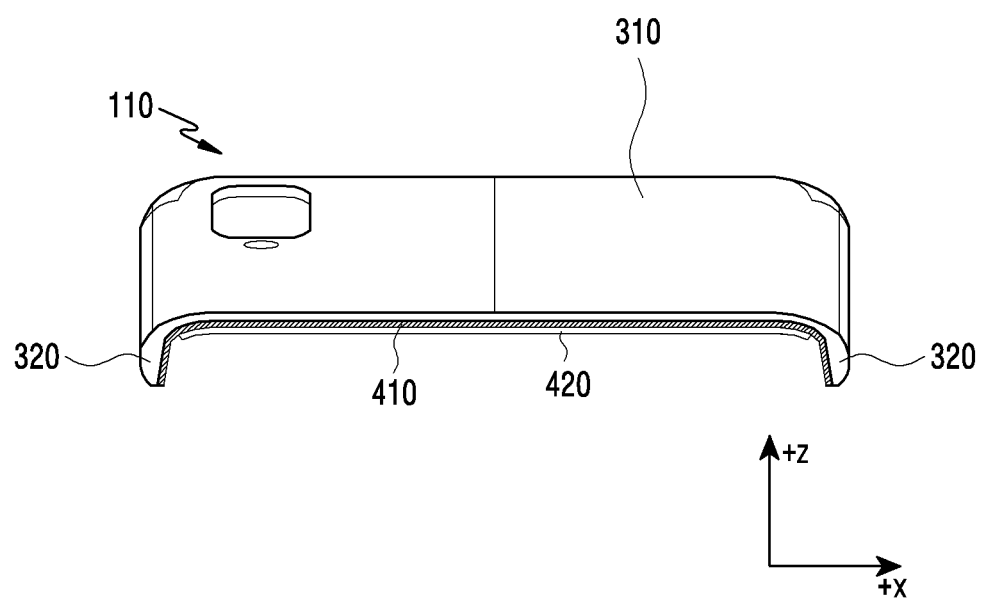
FIG. 4A is a perspective view illustrating a cross section of the housing of FIG. 3, taken on line A-A'.

FIG. 4A is a perspective view illustrating a cross section of the housing 110 of FIG. 3, taken on line A-A'.

Figure 4B:
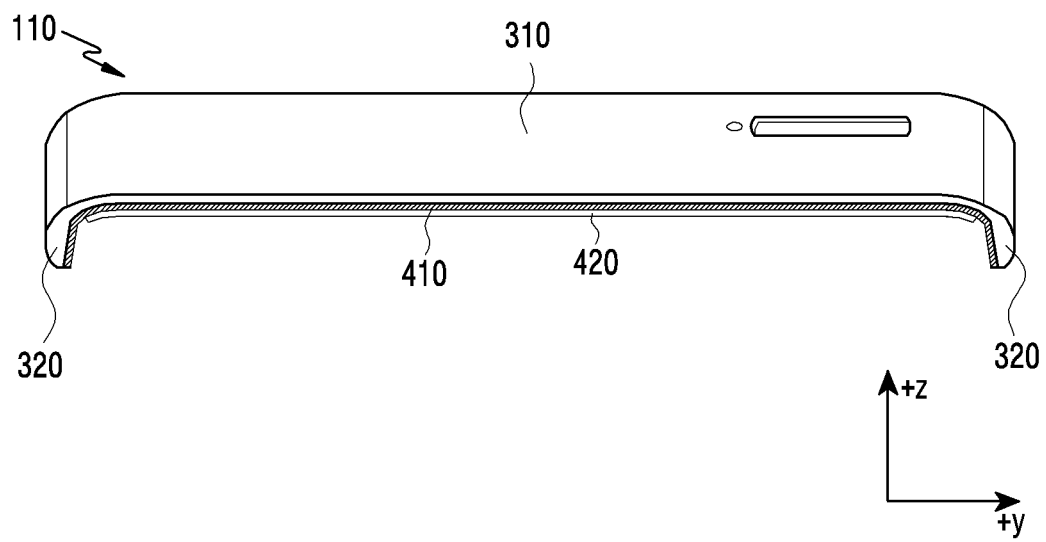
FIG. 4B is a perspective view illustrating a cross section of the housing of FIG. 3, taken on line B-B'.

FIG. 4B is a perspective view illustrating a cross section of the housing 110 of FIG. 3, taken on line B-B'.

Referring to FIG. 3, the housing 110 according to an embodiment may include a bottom portion 310 and a sidewall 320.

In an embodiment, the bottom portion 310 may include a substantially flat area. The bottom portion 310 may be extended outwardly from the center of the housing 110. For example, the bottom portion 310 may be extended from the center of the housing 110 along an x-y plane.

In an embodiment, the sidewall 320 may be extended from an edge of the bottom portion 310 in the height direction of the housing 110. For example, the sidewall 320 may be extended from the edge of the bottom portion 310 in a −z axis direction of FIG. 3.

In an embodiment, the sidewall 320 may include a curved surface. For example, the sidewall 320 may be bent from the edge of the bottom portion 310 and may be extended in the −z axis direction, and the sidewall 320 may be curved to be smoothly extended from the bottom portion 310.

In an embodiment, the housing 110 may provide a space to accommodate components of the electronic device 101 by the bottom portion 310 and the sidewall 320 bent and extended from the bottom portion 310.

In an embodiment, the bottom portion 310 may include an opening 312. The opening 312 may have a camera module 112 and a flash 113 disposed therein.

Referring to FIGS. 4A and 4B, a first film layer 410 may be disposed under (for example, in the −z direction) the housing 110.

In an embodiment, the first film layer 410 may correspond to the bottom portion 310 and the sidewall 320 of the housing 110. For example, the first film layer 410 may overlap the bottom portion 310 and the sidewall 320 of the housing 110.

In an embodiment, the second film layer 420 may be disposed under (for example, in the −z direction) the first film layer 410.

In an embodiment, the second film layer 420 may correspond to the bottom portion 310 of the housing 110. For example, at least a portion of the second film layer 420 may overlap at least a portion of the bottom portion 310.

In an embodiment, the first film layer 410 may include an area that is locally transparent and/or translucent. Since the first film layer 410 includes the area that is transparent and/or translucent and the housing 110 is also transparent, i.e. made of a light transmitting material, the first film layer 410 disposed under the transparent housing 110 and the second film layer disposed under the transparent and/or translucent area of the first film layer 410 may be visible from the outside of the electronic device 101.

In an embodiment, the first film layer 410 and the second film layer 420 may include a non-light transmitting layer. The electronic device 101 according to certain embodiments may prevent inner components of the electronic device 101 to be visible from the outside of the device using the non-light transmitting layer of the first film layer 410 and the second film layer 420, although the housing 110 is substantially transparent.

In an embodiment, the first film layer 410 and the second film layer 420 may include a color layer and/or a stereoscopic pattern layer. The electronic device 101 according to certain embodiments may provide various designed effects, for example, various colors, a texture of metal, and a 3D stereoscopic effect, through the first film layer 410 and the second film layer 420.

Figure 5:
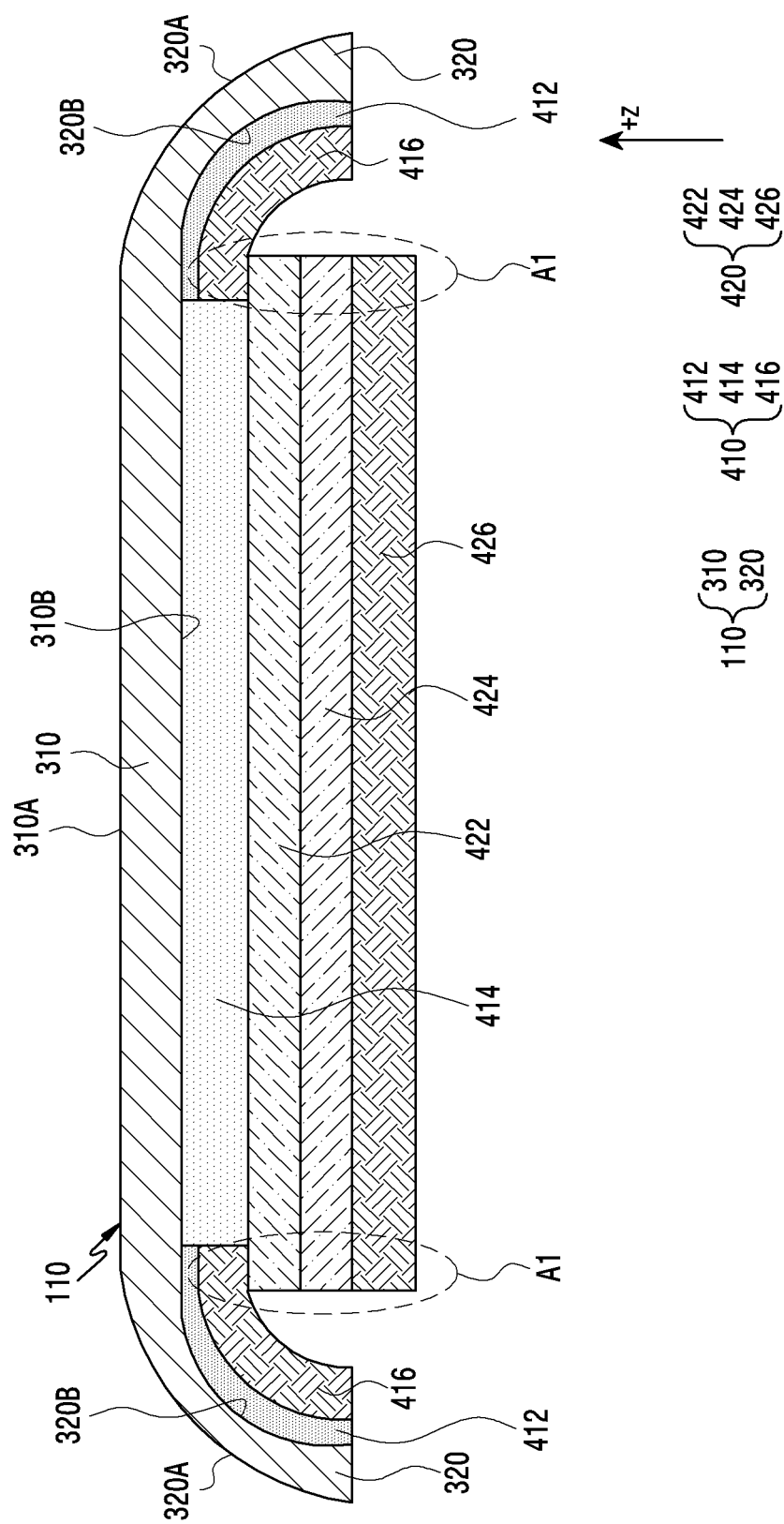
FIG. 5 is a view illustrating a cross section of the housing to which a first film layer and a second film layer are attached according to an embodiment.

FIG. 5 illustrates a cross section of the housing 110 to which the first film layer 410 and the second film layer 420 are attached according to an embodiment.

Referring to FIG. 5, the electronic device according to an embodiment may include the housing 110, the first film layer 410, and the second film layer 420.

The housing 110 according to an embodiment may include the bottom portion 310 and the sidewall 320.

Figure 7A:
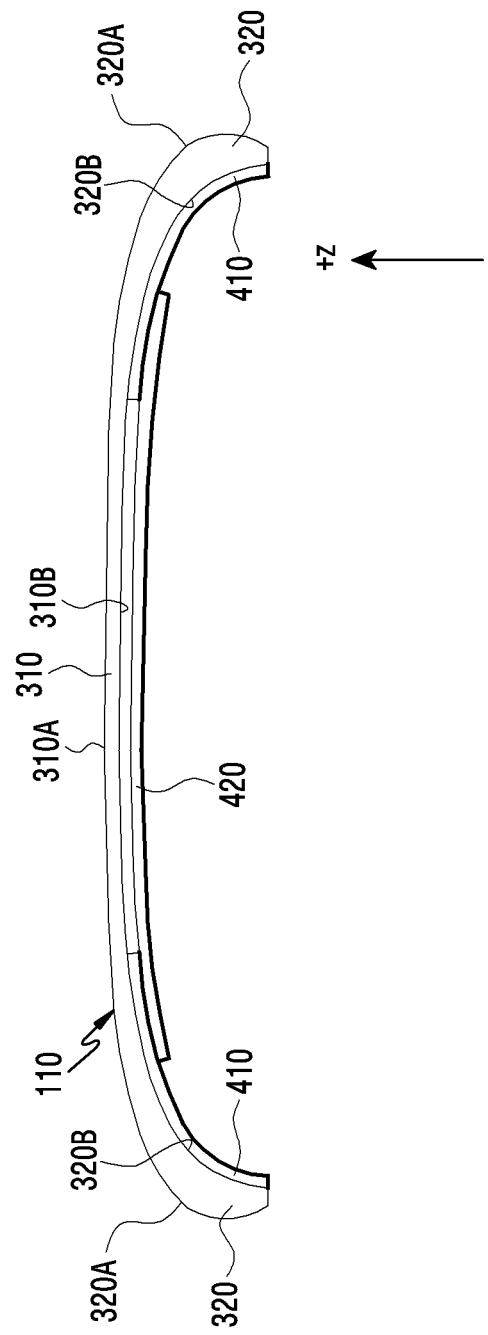
FIG. 7A is a view illustrating an example of a shape of the housing according to an embodiment.

In an embodiment, an outer surface 310A of the bottom portion 310 may be substantially flat. In another embodiment, the entirety of the outer surface 310A of the bottom portion 310 may be curved as shown in FIG. 7A.

In an embodiment, an inner surface 310B of the bottom portion 310 may correspond to the outer surface 310A. For example, the inner surface 310B of the bottom portion 310 may be extended so that it remains the same distance from the outer surface 310A. For example, the inner surface 310B of the bottom portion 310 may be extended along the outer surface 310A with a similar curvature to that of the outer surface 310A.

In an embodiment, an outer surface 320A of the sidewall 320 may be extended from an edge of the outer surface 310A of the bottom portion 310 in the height direction (for example, the −z direction) of the housing 110. For example, the outer surface 320A of the sidewall 320 may be bent from an edge of the outer surface 310A of the bottom portion 310 and may be smoothly extended from the edge. In an embodiment, the outer surface 320A of the sidewall 320 may include a curved surface.

In an embodiment, an inner surface 320B of the sidewall 320 may be extended from an edge of the inner surface 310B of the bottom portion 310 in the height direction (for example, the −z direction) of the housing 110.

Figure 7B:
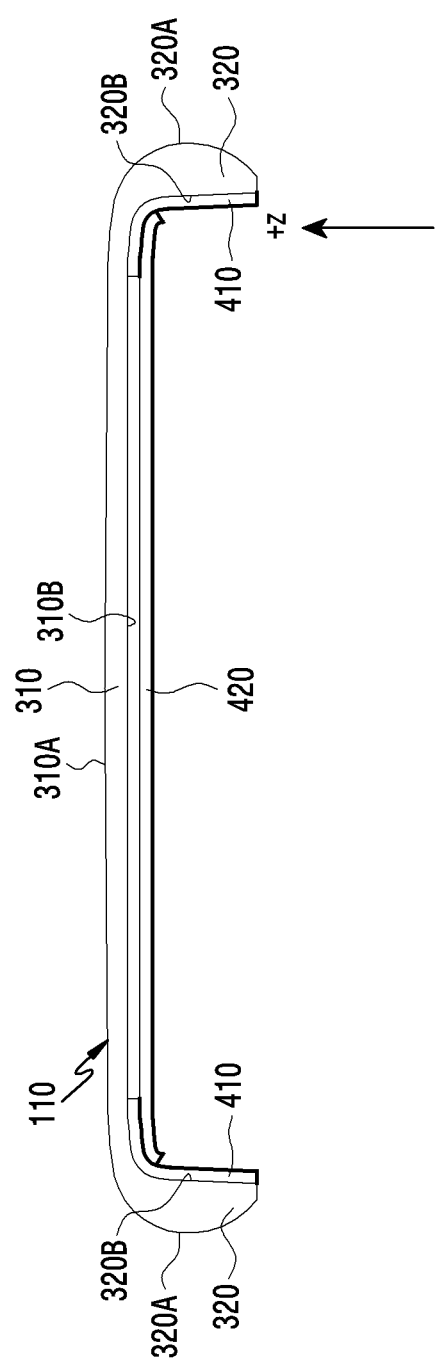
FIG. 7B is a view illustrating an example of a shape of the housing according to an embodiment.

In an embodiment, the inner surface 320B of the sidewall 320 may correspond to the outer surface 320A of the sidewall 320. For example, the inner surface 320B of the sidewall 320 may be extended along the outer surface 320A of the sidewall 320. In another example, the inner surface 320B of the sidewall 320 may be extended with a curvature corresponding to the curvature of the outer surface 320A of the sidewall 320. In yet another embodiment, the inner surface 320B of the sidewall 320 may be extended along the outer surface 320A of the sidewall 320, but may have a different shape from that of the outer surface 320A, as shown in FIG. 7B.

In an embodiment, the bottom portion 310 and the sidewall 320 of the housing 110 may be defined according to various criteria.

For example, a portion of the housing 110 that includes the substantially flat outer surface 310A and the inner surface 310B overlapping the flat outer surface 310A may be defined as the bottom portion 310, and a portion extended from the defined bottom portion 310 may be defined as the sidewall 320.

In another example, a portion of the housing 110 that forms the side surface 101C of the electronic device 101 may be defined as the sidewall 320, and the portion other for the sidewall 320 may be defined as the bottom portion 310.

In another example, a portion that includes the outer surface 310A having a curvature of a first range and the inner surface 310B corresponding to that portion of the outer surface 310A may be defined as the bottom portion 310, and a portion extended from the defined bottom portion 310 may be defined as the sidewall 320. In this case, the outer surface 320A of the sidewall 320 may have a curvature of a second range. In an embodiment, the curvature of the first range and the curvature of the second range may be determined according to shapes of the bottom portion 310 and the sidewall 320. For example, the curvature of the first range and the curvature of the second range may overlap each other in part according to the shapes of the bottom portion 310 and the sidewall 320. Alternatively, a minimum value of the curvature of the second range may be greater than or equal to a maximum value of the curvature of the first range. According to an embodiment, since the outer surface 320A of the sidewall 320 includes an area that is bent and extended from the outer surface 310A of the bottom portion 310, the outer surface 320A of the sidewall 320 may include an area that has a curvature greater than or equal to the curvature of the edge of the outer surface 310A of the bottom portion 310.

In an embodiment, the housing 110 may further include a hard coating layer (for example, a hard coating layer 910 of FIG. 8) which is not shown in FIG. 5. The hard coating layer may be disposed on the outer surface 310A, 320A of the housing 110. The hard coating layer may include an organic material such as acryl, urethane, etc., and/or a silicon-based inorganic material, but is not limited thereto. The hard coating layer may include various materials for protecting the housing 110 from external shock.

The first film layer 410 according to an embodiment may include a transparent printing layer 414, a first color printing layer 412, and a first shielding layer 416.

In an embodiment, the transparent printing layer 414 may be disposed under (for example, in the −z direction) the bottom portion 310 of the housing 110. The transparent printing layer 414 may be in contact with the inner surface 310B of the bottom portion 310.

In an embodiment, the transparent printing layer 414 may correspond to the bottom portion 310. For example, the transparent printing layer 414 may overlap at least a portion of the bottom portion 310.

In an embodiment, the transparent printing layer 414 may include a substantially transparent and/or translucent material, such as an acrylic resin. In an embodiment, the entirety of the transparent printing layer 414 may be formed by a substantially transparent or translucent material, or may be formed by overlapping a first layer which is substantially transparent or translucent and a second layer which is translucent or substantially transparent.

In an embodiment, the first color printing layer 412 may be extended from an edge of the transparent printing layer 414 along the inner surface 320B of the sidewall 320. At least a portion of the first color printing layer 412 may overlap the sidewall 320.

In an embodiment, the first color printing layer 412 may be implemented to have various colors. For example, the first color printing layer 412 may be implemented to have gradation colors, hue, saturation, or intensity of which changes gradually from one edge of the first color printing layer 412 to the other.

In an embodiment, the first color printing layer 412 may have thickness ranging from 3 μm to 10 μm. The thickness may vary according to the color implemented by the first color printing layer 412.

In an embodiment, the first shielding layer 416 may be extended from an edge of the transparent printing layer 414 along with the first color printing layer 412. At least a portion of the first shielding layer 416 may overlap the sidewall 320. In an embodiment, the first shielding layer 416 may be made of a substantially opaque material or may have an opaque color. For example, the first shielding layer 416 may be a resin layer (for example, acrylic resin or urethane resin) having a dark color to be able to shield light. In an embodiment, the first shielding layer 416 may have thickness ranging from 5 μm to 20 μm. In an embodiment, the first shielding layer 416 may hide inner components of the electronic device 101 that may be seen through the sidewall 320, and/or a coupling portion between the housing 110 and other components (for example, the first bracket 120 of FIG. 2). In an embodiment, the first shielding layer 416 may overlap the first color printing layer 412 to protect the first color printing layer 412.

The first film layer 410 according to an embodiment may be attached to the inner surface 310B of the bottom portion 310 and the inner surface 320B of the sidewall 320. Since the first film layer 410 does not include a 3D stereoscopic pattern layer, the film layer can be prevented from being deformed or can be prevented from being unevenly attached to an injection molding material even if the housing 110 includes a 3D curved surface.

The first film layer 410 according to an embodiment may be attached to the housing 110 through various methods.

For example, the first color printing layer 412, the transparent printing layer 414, and the first shielding layer 416 included in the first film layer 410 may be transferred to the housing 110 at the same time when the housing 110 is injection molded. In this case, the first film layer 410 may further include a carrier film such as a PET resin film to form the first color printing layer 412, the transparent printing layer 414, and the first shielding layer 416, and the carrier film may be detached from the housing 110 after the injection molding process is completed.

In another example, the first film layer 410 may be inserted into an injection mold and may be attached to the housing 110 at the same time as the housing 110 is injection molded. In this case, the first film layer 410 may further include a base film layer such as an acrylonitrile butadiene styrene copolymer (ABS) resin to be coupled with the housing 110, which is an injection molding material, and the first film layer 410 may undergo pre-processing such as molding, cutting, heating before being inserted into the mold.

In another example, the first film layer 410 may be laminated on the housing 110 which is formed by injection molding. In this case, an adhesive layer such as an optically clear adhesive (OCA) may be included to bond the first film layer 410 to the housing 110.

The second film layer 420 according to an embodiment may include a base film layer 422, a pattern layer 424, and a second shielding layer 426.

In an embodiment, the base film layer 422 may be a base film for forming the pattern layer 424 and the second shielding layer 426 of the second film layer 420. In an embodiment, the base film layer 422 may include a transparent synthetic resin such as polyethylene terephthalate (PET) or polycarbonate (PC). In an embodiment, the base film layer 422 may have thickness ranging from 45 μm to 50 μm.

In an embodiment, the pattern layer 424 may be disposed under (for example, in the −z direction) the base film layer 422. The pattern layer 424 may include a plurality of stereoscopic patterns. In an embodiment, the plurality of stereoscopic patterns of the pattern layer 424 may vary according to the desired visual effect to be implemented through the pattern layer 424. For example, when a 3D hologram effect is implemented through the pattern layer 424, at least some of the stereoscopic patterns of the pattern layer 424 may have different heights, thicknesses and/or gaps for interference of light.

In an embodiment, at least a portion of the pattern layer 424 may overlap the bottom portion 310 of the housing 110, and the entirety or part of the pattern layer 424 may not overlap the sidewall 320. In an embodiment, since light entering the electronic device 101 is reflected on the pattern layer 424 and passes through the sidewall 320, the user of the electronic device 101 can see the 3D stereoscopic effect provided by the pattern layer 424 even when viewing the electronic device 101 from the side.

In an embodiment, the stereoscopic patterns of the pattern layer 424 may be formed by using a material that can be cured by ultraviolet rays. For example, the stereoscopic patterns of the pattern layer 424 may be implemented by applying an ultraviolet curing material to a mold having a pattern and then curing the material by projecting ultraviolet rays.

In an embodiment, the pattern layer 424 may include a deposition layer (for example, a deposition layer 626 of FIG. 6) included between the plurality of stereoscopic patterns. The deposition layer may function as a background for the plurality of stereoscopic patterns of the pattern layer 424.

In an embodiment, the pattern layer 424 may be seen from the outside of the electronic device 101 through the housing 110 which is substantially transparent, and the transparent printing layer 414 of the first film layer 410. The electronic device 101 according to certain embodiments may have a 3D stereoscopic effect, for example, a prism effect and/or a hologram effect, through the stereoscopic patterns of the pattern layer 424.

In an embodiment, the pattern layer 424 may have thickness ranging from 3 μm to 15 μm.

In an embodiment, the second shielding layer 426 may be disposed under (for example, in the −z direction) the pattern layer 424. In an embodiment, the second shielding layer 426 may be made of a substantially opaque material or a material with a substantially opaque color, such as a dark color. In an embodiment, the second shielding layer 426 may have thickness ranging from 5 μm to 20 μm.

In an embodiment, the second shielding layer 426 may hide inner components of the electronic device 101 that may be visible through the bottom portion 310 of the housing 110. In an embodiment, the second shielding layer 426 may protect the pattern layer 424.

In an embodiment, since most of the second film layer 420 including the pattern layer 424 is attached to the inner surface 310B of the bottom portion 310 that has a relatively small curvature, the second film layer 420 may be attached to the housing 110 without deformation of the second film layer 420 and/or cracking of the pattern layer 424.

In an embodiment, the second film layer 420 may overlap a portion of the first color printing layer 412 of the first film layer 410 and a portion of the second shielding layer 426 (area A1).

Without the overlap in area A1, even when the electronic device includes the first shielding layer 416 and the second shielding layer 426, inner components of the electronic device 101 may be visible from the outside through the housing 110 and the transparent printing layer 414 because of errors in the process of attaching the first film layer 410 to the housing 110 and/or errors in the process of attaching the second film layer 420 to the first film layer 410. But since the second film layer 420 including the second shielding layer 426 that overlaps the first shielding layer 416 in the area A1, the electronic device 101 according to an embodiment can prevent inner components of the electronic device 101 from being seen from the outside even if there are errors in the film layer attaching processes.

Since the first film layer 410 and the second film layer 420 are stacked under the housing 110, the boundary between the first film layer 410 and the second film layer 420 may be visually highlighted from the outside of the electronic device 101. The electronic device 101 according to an embodiment can reduce the extent to which the boundary between the first film layer 410 and the second film layer 420 is visually highlighted, by overlapping the first film layer 410 and the second film layer 420 in the area A1.

In an embodiment, the length of a section where the first film layer 410 and the second film layer 420 overlap in the area A1 may be longer than or equal to 20 mm. For example, the second film layer 420 may overlap a portion of the first printing color layer 412 and a portion of the first shielding layer 416 in the area A1 as shown in FIG. 5, and unlike that illustrated, the second film layer 420 may be extended up to an edge of the first film layer 410 and may overlap the entirety of the first color printing layer 412 and the first shielding layer 416.

FIG. 6 illustrates a cross section of the first film layer 410 and the second film layer 420 according to an embodiment.

The components shown in FIG. 6 that are the same or similar to those illustrated in FIGS. 1, 2, 3, 4A, 4B, and 5 will not be described again. For those components references will be made to the descriptions of FIGS. 1, 2, 3, 4A, 4B, and 5.

Referring to FIG. 6, the transparent printing layer 414 according to an embodiment may include a first layer 612 and a second layer 614. The first layer 612 may include a material that is substantially transparent or translucent, or may be implemented by a substantially transparent or translucent color. The second layer 614 may be disposed under (for example, in the −z direction) the first layer 612. The second layer 614 may include a material that is substantially transparent or translucent, or may be implemented by a transparent or translucent color.

The second film layer 420 according to an embodiment may include an adhesive layer 622, a second color printing layer 624, a deposition layer 626, and a third color printing layer 628.

In an embodiment, the adhesive layer 622 may be disposed under the first film layer 410. The second film layer 420 may be attached to the first film layer 420 through the adhesive layer 622. The adhesive layer 622 may include an OCA having thickness of about 25 μm.

In an embodiment, the second color printing layer 624 may be disposed between the base film layer 422 and the pattern layer 424. The second color printing layer 624 may include various colors. For example, the second color printing layer 624 may include gradation colors, hue, saturation, or intensity of which change. In an embodiment, when the second color printing layer 624 has a similar color to that of the first color printing layer 412, a phenomenon in which the first film layer 410 and the second film layer 420 are seen as being separated with reference to an edge of the transparent printing layer 414 can be enhanced.

In an embodiment, the deposition layer 626 may be disposed under the pattern layer 424. In an embodiment, the deposition layer 626 may be formed by using TiO2, SiO2, Sn, Al, In, or a combination thereof. In an embodiment, the deposition layer 626 may function as a background for the plurality of stereoscopic patterns included in the pattern layer 424, may highlight the 3D stereoscopic effect implemented by the pattern layer 424, and may provide a metallic texture for the housing 110. In an embodiment, the deposition layer 626 may have thickness ranging from 10 nm to 50 nm.

In an embodiment, the third color printing layer 628 may be disposed under the deposition layer 626. The third color printing layer 628 may include various colors and may function as a background for the pattern layer 424 and/or the deposition layer 626. The third color printing layer 628 may be formed through gravure printing or silk screen printing. To print the third color printing layer 628 smoothly, a primer may be coated under the deposition layer 626 before the third color printing layer 628 is formed. In an embodiment, the third color printing layer 628 may have thickness of 10 μm or less.

Alternatively, when the second film layer 420 includes the deposition layer 626, the second film layer 420 may not include the third color printing layer 628, which is not shown in FIG. 6.

In an embodiment, the second shielding layer 426 may be made of a substantially opaque material or may have dark color. In an embodiment, the second shielding layer 426 may have thickness ranging from 5 μm to 20 μm.

FIG. 7A illustrates an example of a shape of the housing 110 according to an embodiment, and FIG. 7B illustrates an example of a shape of the housing 110 according to another embodiment.

Referring to FIGS. 7A and 7B, the outer surface 310A of the bottom portion 310 according to an embodiment may be extended with a curvature of a first range. The inner surface 310B of the bottom portion 310 may be extended along the outer surface 310A.

In an embodiment, the outer surface 320A of the sidewall 320 may be extended from the outer surface 310A of the bottom portion 310 with a curvature of a second range. The inner surface 320B of the sidewall 320 may be extended from the inner surface 310B of the bottom portion 310 along the outer surface 320A of the sidewall 320.

The minimum value of the curvature of the second range may be greater than or equal to the maximum value of the curvature of the first range. The bending degree of the outer surface 320A of the sidewall 320 may be larger than the bending degree of the outer surface 310A of the bottom portion 310.

Referring to FIG. 7B, the inner surface 320B of the sidewall 320 may be extended from the inner surface 310B of the bottom portion 310 along the outer surface 320A of the sidewall 320, but may be extended with a different curvature from that of the outer surface 320A of the sidewall 320, unlike that in the housing 110 shown in FIG. 7A. For example, the inner surface 320B of the sidewall 320 may include a substantially flat surface. In another example, the outer surface 320A of the sidewall 320 may be extended from the bottom portion 310 with the curvature of the second range, but the inner surface 320B of the sidewall 320 may be bent from an edge of the inner surface 310B of the bottom portion 310 and may be extended substantially in parallel with the z axis.

Figure 8:
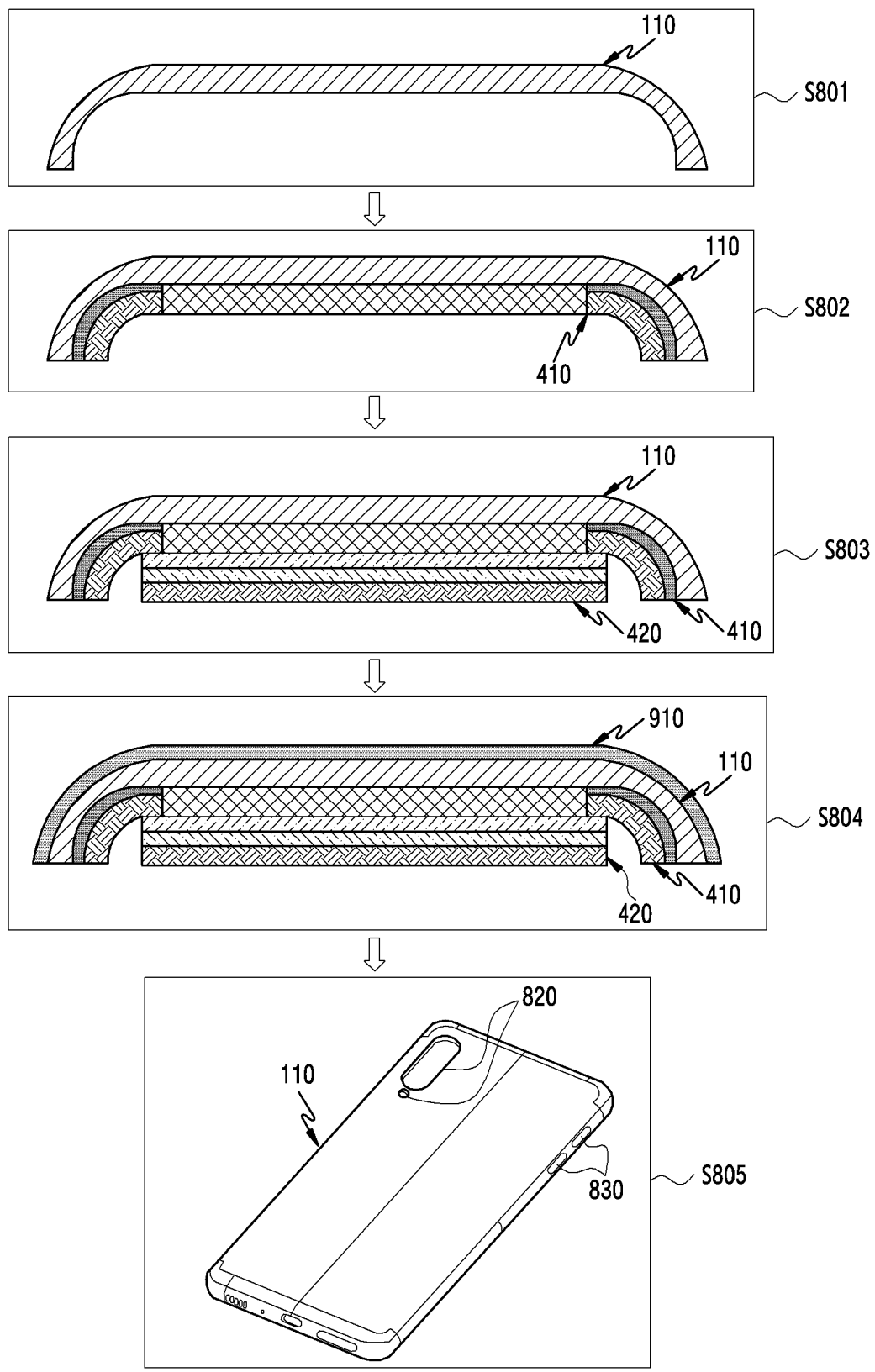
FIG. 8 is a view illustrating a manufacturing process of the housing including the first film layer and the second film layer according to an embodiment.

FIG. 8 illustrates a process of manufacturing the housing 110 including the first film layer 410 and the second film layer 420 according to an embodiment.

Referring to FIG. 8, at step 801, the housing 110 according to an embodiment may be manufactured through an injection molding process. For example, the housing 110 may be manufactured through the process of injecting a melted resin into a mold corresponding to the shape of the housing 110 and solidifying the resin.

At step 802, the first film layer 410 according to an embodiment may be disposed on the housing 110. For example, the first film layer 410 may be transferred or attached to the housing 110 at the same time as the injection molding process of the housing 110 or after the injection molding process is completed.

At step 803, the second film layer 420 may be attached to the first film layer 410. For example, the second film layer 420 may be attached to the first film layer 420 by using an adhesive (for example, the adhesive layer 622 of FIG. 6). The area to which the second film layer 420 is attached is not limited to a flat surface area of the housing 110, and the second film layer 420 may be attached to a curved area of the housing 110. The second film layer 420 attached to the housing 110 (or the first film layer 410) may have a curve corresponding to the curve of an area of the housing 110 that overlaps the second film layer 420.

At step 804, a hard coating layer 910 may be disposed on the housing 110 on which the first film layer 410 and the second film layer 420 are disposed. For example, the hard coating layer 910 may be formed through a process of coating a hard coating liquid including an organic material (for example, acryl, urethane) and/or an inorganic material (for example, silicon) over an outer surface of the housing 110, and curing the material.

At step 805, the opening 820, 830 may be formed on the housing 110 on which the hard coating layer 910 is formed. For example, the opening 820 through which a camera module (for example, the camera module 112 of FIG. 1) is exposed, and/or the opening 830 through which a key input device (for example, the key input device 117 of FIG. 1) is exposed may be formed by performing computerized numerical control (CNC) processing with respect to the housing 110 for which the hard coating process has been completed.

Figure 9:
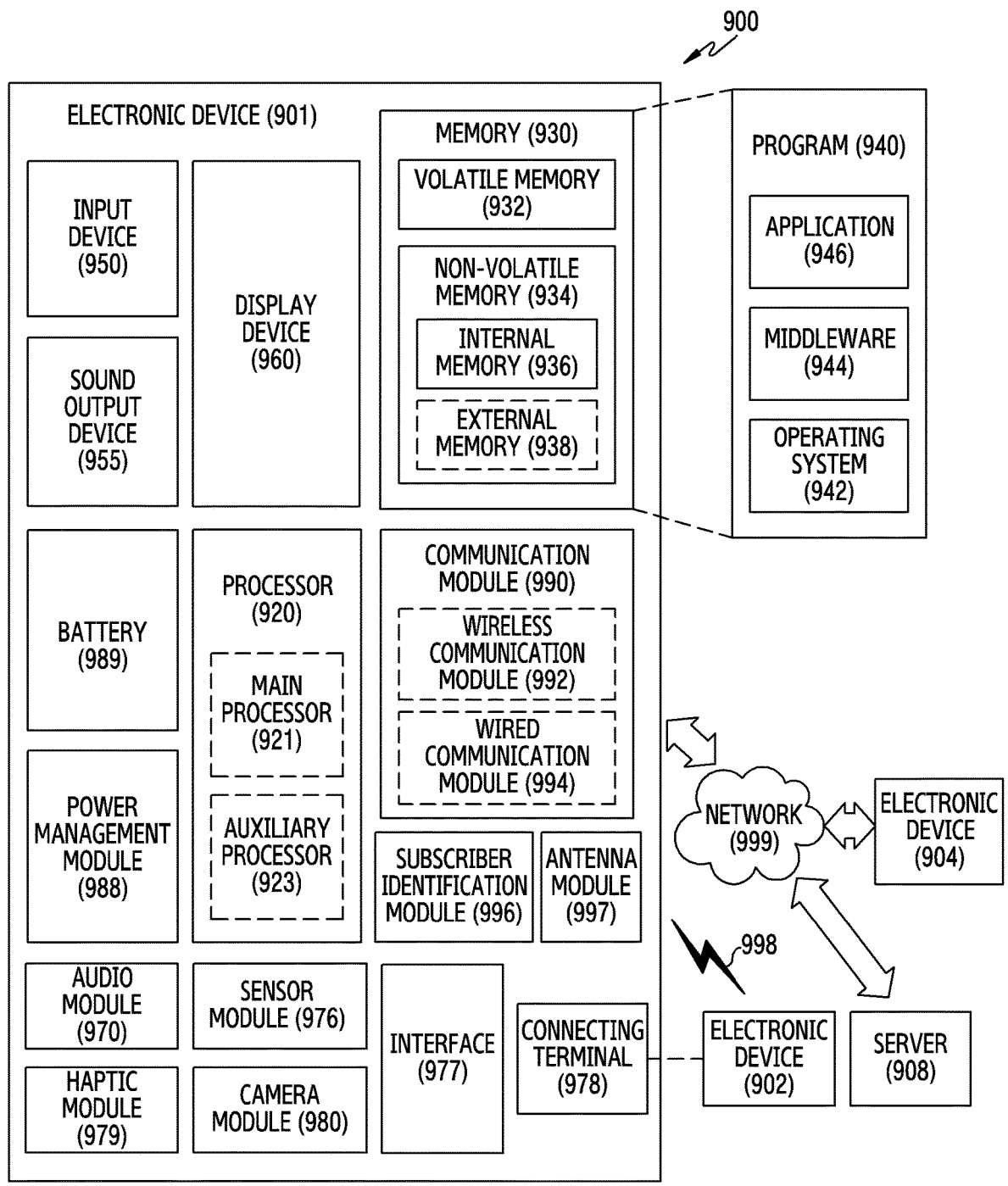
FIG. 9 is a block diagram of an electronic device in a network environment according to an embodiment.

FIG. 9 is a block diagram illustrating an electronic device 901 in a network environment 900 according to various embodiments. Referring to FIG. 9, the electronic device 901 in the network environment 900 may communicate with an electronic device 902 via a first network 998 (e.g., a short-range wireless communication network), or an electronic device 904 or a server 908 via a second network 999 (e.g., a long-range wireless communication network). According to an embodiment, the electronic device 901 may communicate with the electronic device 904 via the server 908. According to an embodiment, the electronic device 901 may include a processor 920, memory 930, an input device 950, a sound output device 955, a display device 960, an audio module 970, a sensor module 976, an interface 977, a haptic module 979, a camera module 980, a power management module 988, a battery 989, a communication module 990, a subscriber identification module (SIM) 996, or an antenna module 997. In some embodiments, at least one (e.g., the display device 960 or the camera module 980) of the components may be omitted from the electronic device 901, or one or more other components may be added in the electronic device 901. In some embodiments, some of the components may be implemented as single integrated circuitry. For example, the sensor module 976 (e.g., a fingerprint sensor, an iris sensor, or an illuminance sensor) may be implemented as embedded in the display device 960 (e.g., a display).

The processor 920 may execute, for example, software (e.g., a program 940) to control at least one other component (e.g., a hardware or software component) of the electronic device 901 coupled with the processor 920, and may perform various data processing or computation. According to one embodiment, as at least part of the data processing or computation, the processor 920 may load a command or data received from another component (e.g., the sensor module 976 or the communication module 990) in volatile memory 932, process the command or the data stored in the volatile memory 932, and store resulting data in non-volatile memory 934. According to an embodiment, the processor 920 may include a main processor 921 (e.g., a central processing unit (CPU) or an application processor (AP)), and an auxiliary processor 923 (e.g., a graphics processing unit (GPU), an image signal processor (ISP), a sensor hub processor, or a communication processor (CP)) that is operable independently from, or in conjunction with, the main processor 921. Additionally or alternatively, the auxiliary processor 923 may be adapted to consume less power than the main processor 921, or to be specific to a specified function. The auxiliary processor 923 may be implemented as separate from, or as part of the main processor 921.

The auxiliary processor 923 may control at least some of functions or states related to at least one component (e.g., the display device 960, the sensor module 976, or the communication module 990) among the components of the electronic device 901, instead of the main processor 921 while the main processor 921 is in an inactive (e.g., sleep) state, or together with the main processor 921 while the main processor 921 is in an active state (e.g., executing an application). According to an embodiment, the auxiliary processor 923 (e.g., an image signal processor or a communication processor) may be implemented as part of another component (e.g., the camera module 980 or the communication module 990) functionally related to the auxiliary processor 923.

The memory 930 may store various data used by at least one component (e.g., the processor 920 or the sensor module 976) of the electronic device 901. The various data may include, for example, software (e.g., the program 940) and input data or output data for a command related thereto. The memory 930 may include the volatile memory 932 or the non-volatile memory 934.

The program 940 may be stored in the memory 930 as software, and may include, for example, an operating system (OS) 942, middleware 944, or an application 946.

The input device 950 may receive a command or data to be used by other component (e.g., the processor 920) of the electronic device 901, from the outside (e.g., a user) of the electronic device 901. The input device 950 may include, for example, a microphone, a mouse, a keyboard, or a digital pen (e.g., a stylus pen).

The sound output device 955 may output sound signals to the outside of the electronic device 901. The sound output device 955 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 960 may visually provide information to the outside (e.g., a user) of the electronic device 901. The display device 960 may include, for example, a display, a hologram device, or a projector and control circuitry to control a corresponding one of the display, hologram device, and projector. According to an embodiment, the display device 960 may include touch circuitry adapted to detect a touch, or sensor circuitry (e.g., a pressure sensor) adapted to measure the intensity of force incurred by the touch.

The audio module 970 may convert a sound into an electrical signal and vice versa. According to an embodiment, the audio module 970 may obtain the sound via the input device 950, or output the sound via the sound output device 955 or a headphone of an external electronic device (e.g., an electronic device 902) directly (e.g., wiredly) or wirelessly coupled with the electronic device 901.

The sensor module 976 may detect an operational state (e.g., power or temperature) of the electronic device 901 or an environmental state (e.g., a state of a user) external to the electronic device 901, and then generate an electrical signal or data value corresponding to the detected state. According to an embodiment, the sensor module 976 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 977 may support one or more specified protocols to be used for the electronic device 901 to be coupled with the external electronic device (e.g., the electronic device 902) directly (e.g., wiredly) or wirelessly. According to an embodiment, the interface 977 may include, for example, a high definition multimedia interface (HDMI), a universal serial bus (USB) interface, a secure digital (SD) card interface, or an audio interface.

A connecting terminal 978 may include a connector via which the electronic device 901 may be physically connected with the external electronic device (e.g., the electronic device 902). According to an embodiment, the connecting terminal 978 may include, for example, a HDMI connector, a USB connector, a SD card connector, or an audio connector (e.g., a headphone connector).

The haptic module 979 may convert an electrical signal into a mechanical stimulus (e.g., a vibration or a movement) or electrical stimulus which may be recognized by a user via his tactile sensation or kinesthetic sensation. According to an embodiment, the haptic module 979 may include, for example, a motor, a piezoelectric element, or an electric stimulator.

The camera module 980 may capture a still image or moving images. According to an embodiment, the camera module 980 may include one or more lenses, image sensors, image signal processors, or flashes.

The power management module 988 may manage power supplied to the electronic device 901. According to one embodiment, the power management module 988 may be implemented as at least part of, for example, a power management integrated circuit (PMIC).

The battery 989 may supply power to at least one component of the electronic device 901. According to an embodiment, the battery 989 may include, for example, a primary cell which is not rechargeable, a secondary cell which is rechargeable, or a fuel cell.

The communication module 990 may support establishing a direct (e.g., wired) communication channel or a wireless communication channel between the electronic device 901 and the external electronic device (e.g., the electronic device 902, the electronic device 904, or the server 908) and performing communication via the established communication channel. The communication module 990 may include one or more communication processors that are operable independently from the processor 920 (e.g., the application processor (AP)) and supports a direct (e.g., wired) communication or a wireless communication. According to an embodiment, the communication module 990 may include a wireless communication module 992 (e.g., a cellular communication module, a short-range wireless communication module, or a global navigation satellite system (GNSS) communication module) or a wired communication module 994 (e.g., a local area network (LAN) communication module or a power line communication (PLC) module). A corresponding one of these communication modules may communicate with the external electronic device via the first network 998 (e.g., a short-range communication network, such as Bluetooth™, wireless-fidelity (Wi-Fi) direct, or infrared data association (IrDA)) or the second network 999 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 992 may identify and authenticate the electronic device 901 in a communication network, such as the first network 998 or the second network 999, using subscriber information (e.g., international mobile subscriber identity (IMSI)) stored in the subscriber identification module 996.

The antenna module 997 may transmit or receive a signal or power to or from the outside (e.g., the external electronic device) of the electronic device 901. According to an embodiment, the antenna module 997 may include an antenna including a radiating element composed of a conductive material or a conductive pattern formed in or on a substrate (e.g., PCB). According to an embodiment, the antenna module 997 may include a plurality of antennas. In such a case, at least one antenna appropriate for a communication scheme used in the communication network, such as the first network 998 or the second network 999, may be selected, for example, by the communication module 990 (e.g., the wireless communication module 992) from the plurality of antennas. The signal or the power may then be transmitted or received between the communication module 990 and the external electronic device via the selected at least one antenna. According to an embodiment, another component (e.g., a radio frequency integrated circuit (RFIC)) other than the radiating element may be additionally formed as part of the antenna module 997.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 901 and the external electronic device 904 via the server 908 coupled with the second network 999. Each of the electronic devices 902 and 904 may be a device of a same type as, or a different type, from the electronic device 901. According to an embodiment, all or some of operations to be executed at the electronic device 901 may be executed at one or more of the external electronic devices 902, 904, or 908. For example, if the electronic device 901 should perform a function or a service automatically, or in response to a request from a user or another device, the electronic device 901, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 901. The electronic device 901 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 940) including one or more instructions that are stored in a storage medium (e.g., internal memory 936 or external memory 938) that is readable by a machine (e.g., the electronic device 901). For example, a processor (e.g., the processor 920) of the machine (e.g., the electronic device 901) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

An electronic device according to an embodiment may include: a window configured to form at least a portion of a front surface of the electronic device; a display disposed in a first direction of the window; a housing configured to form a rear surface of the electronic device and at least a portion of a side surface, and to accommodate the window and the display, a rear surface of the housing including a first surface having a curvature of a first range and a second surface having a curvature of a second range and extended from the first surface toward the window; a first film layer disposed on an inner surface of the housing facing the rear surface of the housing, the first film layer including: a first area that overlaps at least a portion of the first surface and is substantially transparent or translucent; and a second area that is extended from an edge of the first area along the second surface, and is substantially opaque; and a second film layer disposed on the first film layer in a second direction opposite to the first direction, the second film layer overlapping an entirety of the first area of the first film layer and overlapping a portion of the second area.

In an embodiment, at least a portion of the second area may overlap the second surface, and the first film layer may include a shielding layer that is disposed in the second area and is substantially opaque.

In an embodiment, the first film layer may include a color printing layer that is disposed between the second surface and the shielding layer in the second area.

In an embodiment, the color printing layer may have gradation colors.

In an embodiment, the first film layer may include: a first layer that is disposed in the first area and is substantially transparent or translucent; and a second layer that is disposed in the first area on the first layer in the second direction and is substantially transparent or translucent, and the color printing layer may be extended from an edge of the first layer, and the shielding layer may be extended from an edge of the second layer.

In an embodiment, the second film layer may include a pattern layer configured to provide a 3D stereoscopic effect.

In an embodiment, the pattern layer may be an ultraviolet (UV) molding pattern layer.

In an embodiment, the second film layer may include a shielding layer that is disposed on the pattern layer in the second direction, and is substantially opaque.

In an embodiment, the second film layer may include a deposition layer disposed between the pattern layer and the shielding layer.

In an embodiment, the second film layer may include a color printing layer disposed between the deposition layer and the shielding layer.

In an embodiment, the color printing layer may have gradation colors.

In an embodiment, the second film layer may include a base film for forming the pattern layer, and the base film may be disposed between the first film layer and the pattern layer.

In an embodiment, the second film layer may include an adhesive layer configured to attach the second film layer to the first film layer, and the adhesive layer may be disposed between the first film layer and the base film.

In an embodiment, the first surface of the housing may include a substantially flat area.

In an embodiment, the housing may be substantially transparent, and a minimum value of the second range may be greater than or equal to a maximum value of the first range.

An electronic device according to an embodiment may include: a window configured to form at least a portion of a front surface of the electronic device; a transparent housing configured to form a rear surface of the electronic device and at least a portion of a side surface, and disposed under the window, the transparent housing including a bottom portion substantially parallel to the window and a sidewall bent from an edge of the bottom portion toward the window; a first film layer disposed on an inner surface of the transparent housing facing the rear surface across the bottom portion and the sidewall, the first film layer including: a transparent printing layer overlapping at least a portion of the bottom portion; a first color printing layer in contact with the sidewall and extended from an edge of the transparent printing layer along the sidewall; and a first shielding layer in contact with the first color printing layer and extended from the edge of the transparent printing layer along the first color printing layer; and a second film layer disposed under the first film layer and overlaps a portion of the first color printing layer and a portion of the first shielding layer.

In an embodiment, the second film layer may include a UV molding pattern layer.

In an embodiment, the second film layer may include a second shielding layer disposed under the UV molding pattern layer.

In an embodiment, the second film layer may include a deposition layer disposed between the UV molding pattern layer and the second shielding layer, and a second color printing layer disposed between the bottom portion and the UV molding pattern layer.

In an embodiment, a rear surface of the bottom portion may include a substantially flat area, and a rear surface of the sidewall extended from the rear surface of the bottom portion may include a curved surface.

The electronic device according to certain embodiments can provide a housing in which color and 3D stereoscopic pattern are implemented.

The electronic device according to certain embodiments can provide a housing in which color and 3D stereoscopic pattern are implemented even when the housing includes a 3D curved area.

The electronic device according to certain embodiments can provide a housing to which a film having color and 3D stereoscopic pattern is evenly attached even when the housing includes a 3D curved area.

The electronic device according to certain embodiments can provide a housing that hides inner components of the electronic device and also provides a designed effect such as color and 3D effect even when the housing is substantially transparent.

The effects achieved in the disclosure are not limited to those mentioned above, and other effects that are not mentioned above may be clearly understood to those skilled in the art based on the description provided above Methods based on the claims or the embodiments disclosed in the disclosure may be implemented in hardware, software, or a combination of both.

When implemented in software, a computer readable storage medium for storing one or more programs (software modules) may be provided. The one or more programs stored in the computer readable storage medium are configured for execution performed by one or more processors in an electronic device. The one or more programs include instructions for allowing the electronic device to execute the methods based on the claims or the embodiments disclosed in the disclosure.

The program (the software module or software) may be stored in a random access memory, a non-volatile memory including a flash memory, a read only memory (ROM), an electrically erasable programmable read only memory (EEPROM), a magnetic disc storage device, a compact disc-ROM (CD-ROM), digital versatile discs (DVDs) or other forms of optical storage devices, and a magnetic cassette. Alternatively, the program may be stored in a memory configured in combination of all or some of these storage media. In addition, the configured memory may be plural in number.

Further, the program may be stored in an attachable storage device capable of accessing the electronic device through a communication network such as the Internet, an Intranet, a local area network (LAN), a wide LAN (WLAN), or a storage area network (SAN) or a communication network configured by combining the networks. The storage device may access via an external port to a device which performs the embodiments of the disclosure. In addition, an additional storage device on a communication network may access to a device which performs the embodiments of the disclosure.

In the above-described specific embodiments of the disclosure, elements included in the disclosure are expressed in singular or plural forms according to specific embodiments. However, singular or plural forms are appropriately selected according to suggested situations for convenience of explanation, and the disclosure is not limited to a single element or plural elements. An element which is expressed in a plural form may be configured in a singular form or an element which is expressed in a singular form may be configured in plural number.

While the disclosure has been shown and described with reference to certain preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:

1. An electronic device comprising:
a window configured to form at least a portion of a front surface of the electronic device;
a display disposed in a first direction of the window;
a housing configured to form a rear surface of the electronic device and at least a portion of a side surface, and to accommodate the window and the display, a rear surface of the housing including a first surface having a curvature of a first range and a second surface having a curvature of a second range and extended from the first surface toward the window;
a first film layer disposed on an inner surface of the housing facing the rear surface of the housing, the first film layer including a first area that overlaps at least a portion of the first surface and is substantially transparent or translucent, and a second area that is laterally extended from an edge of the first area along the second surface, and is substantially opaque; and
a second film layer disposed on the first film layer in a second direction opposite to the first direction, the second film layer overlapping an entirety of the first area of the first film layer and overlapping a portion of the second area.

2. The electronic device of claim 1, wherein at least the portion of the second area overlaps the second surface, and
wherein the first film layer further comprises a shielding layer that is disposed in the second area and is substantially opaque.

3. The electronic device of claim 2, wherein the first film layer further comprises a color printing layer that is disposed between the second surface and the shielding layer in the second area.

4. The electronic device of claim 3, wherein the color printing layer has gradation colors.

5. The electronic device of claim 3, wherein the first film layer further comprises:
a first layer that is disposed in the first area and is substantially transparent or translucent; and
a second layer that is disposed in the first area on the first layer in the second direction and is substantially transparent or translucent,
wherein the color printing layer is extended from an edge of the first layer, and
wherein the shielding layer is extended from an edge of the second layer.

6. The electronic device of claim 1, wherein the second film layer further comprises a pattern layer configured to provide a 3D stereoscopic effect.

7. The electronic device of claim 6, wherein the pattern layer is an ultraviolet (UV) molding pattern layer.

8. The electronic device of claim 6, wherein the second film layer further comprises a shielding layer that is disposed on the pattern layer in the second direction, and is substantially opaque.

9. The electronic device of claim 8, wherein the second film layer further comprises a deposition layer disposed between the pattern layer and the shielding layer.

10. The electronic device of claim 9, wherein the second film layer further comprises a color printing layer disposed between the deposition layer and the shielding layer.

11. The electronic device of claim 10, wherein the color printing layer has gradation colors.

12. The electronic device of claim 6, wherein the second film layer further comprises a base film for forming the pattern layer, and
wherein the base film is disposed between the first film layer and the pattern layer.

13. The electronic device of claim 12, wherein the second film layer further comprises an adhesive layer configured to attach the second film layer to the first film layer, and
wherein the adhesive layer is disposed between the first film layer and the base film.

14. The electronic device of claim 1, wherein the first surface of the housing comprises a substantially flat area.

15. The electronic device of claim 1, wherein the housing is substantially transparent, and
wherein a minimum value of the second range is greater than or equal to a maximum value of the first range.

16. An electronic device comprising:
a window configured to form at least a portion of a front surface of the electronic device;
a transparent housing configured to form a rear surface of the electronic device and at least a portion of a side surface, and disposed under the window, the transparent housing including a bottom portion substantially parallel to the window and a sidewall bent from an edge of the bottom portion toward the window;
a first film layer disposed on an inner surface of the transparent housing facing the rear surface across the bottom portion and the sidewall, the first film layer including a transparent printing layer overlapping at least a portion of the bottom portion, a first color printing layer in contact with the sidewall and extended from an edge of the transparent printing layer along the sidewall, and a first shielding layer in contact with the first color printing layer and extended from the edge of the transparent printing layer along the first color printing layer; and
a second film layer disposed under the first film layer and overlaps a portion of the first color printing layer and a portion of the first shielding layer.

17. The electronic device of claim 16, wherein the second film layer further comprises a UV molding pattern layer.

18. The electronic device of claim 17, wherein the second film layer further comprises a second shielding layer disposed under the UV molding pattern layer.

19. The electronic device of claim 18, wherein the second film layer further comprises a deposition layer disposed between the UV molding pattern layer and the second shielding layer, and a second color printing layer disposed between the bottom portion and the UV molding pattern layer.

20. The electronic device of claim 16, wherein a rear surface of the bottom portion comprises a substantially flat area, and
   wherein a rear surface of the sidewall extended from the rear surface of the bottom portion comprises a curved surface.

* * * * *